United States Patent
Plößl

(10) Patent No.: US 9,502,376 B2
(45) Date of Patent: Nov. 22, 2016

(54) PROCESS FOR CONNECTING JOINING PARTS

(71) Applicant: OSRAM Opto Semiconductors GmbH, Regensburg (DE)

(72) Inventor: Andreas Plößl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/773,970

(22) PCT Filed: Mar. 24, 2014

(86) PCT No.: PCT/EP2014/055848
§ 371 (c)(1),
(2) Date: Sep. 9, 2015

(87) PCT Pub. No.: WO2014/154637
PCT Pub. Date: Oct. 2, 2014

(65) Prior Publication Data
US 2016/0027759 A1    Jan. 28, 2016

(30) Foreign Application Priority Data

Mar. 26, 2013  (DE) .................. 10 2013 103 081

(51) Int. Cl.
*H01L 21/288*  (2006.01)
*H01L 21/285*  (2006.01)
(Continued)

(52) U.S. Cl.
CPC .......... *H01L 24/83* (2013.01); *H01L 21/2855* (2013.01); *H01L 21/2885* (2013.01);
(Continued)

(58) Field of Classification Search
CPC ... H01L 24/83; H01L 24/29; H01L 21/2885; H01L 2224/83902; H01L 2224/83539; H01L 24/27; H01L 21/76874; H01L 2224/29084; H01L 2224/27462; H01L 2224/2745; H01L 2224/29082; H01L 2224/29109; H01L 2224/29166; H01L 2224/32245; H01L 2224/83203; H01L 2224/29113; H01L 2224/13113; H01L 2224/13309; H01L 2924/00; H01L 2224/29313; H01L 2924/014; H01L 2224/29339; H01L 2224/838; H01L 2924/00014; H01L 2224/48465; H01L 2224/0401
See application file for complete search history.

(56) References Cited

U.S. PATENT DOCUMENTS 4,098,452 A * 7/1978 Webster .................. B23K 1/20
228/123.1
7,598,529 B2   10/2009 Ploessl et al.
(Continued)

FOREIGN PATENT DOCUMENTS

DE            68911649 T2    6/1994
DE         102005029246 A1  10/2006
(Continued)

OTHER PUBLICATIONS

Cook, G.O. et al., "Overview of transient liquid phase and partial transient liquid phase bonding," Journal of Materials Science, vol. 46, Issue 16, May 17, 2011, pp. 5305-5323.
(Continued)

Primary Examiner — Jasmine Clark
(74) Attorney, Agent, or Firm — Slater Matsil, LLP

(57) ABSTRACT

A method is provided for connecting parts to be joined. A first layer sequence is applied to a first part to be joined. The first layer sequence contains silver. A second layer sequence is applied to a second part to be joined. The second layer sequence contains indium and bismuth. The first layer sequence and the second layer sequence are pressed together at their end faces respectively remote from the first part to be joined and the second part to be joined through application of a joining pressure at a joining temperature which amounts to at most 120° C. for a predetermined joining time. The first layer sequence and the second layer sequence fuse together to form a bonding layer which directly adjoins the first part to be joined and the second part to be joined and the melting temperature of which amounts to at least 260° C.

21 Claims, 5 Drawing Sheets

(51) Int. Cl.
*H01L 21/768* (2006.01)
*H01L 23/00* (2006.01)

(52) U.S. Cl.
CPC ......... *H01L21/76874* (2013.01); *H01L 24/27* (2013.01); *H01L 24/29* (2013.01); *H01L 24/32* (2013.01); *H01L 2224/2745* (2013.01); *H01L 2224/27444* (2013.01); *H01L 2224/27462* (2013.01); *H01L 2224/27464* (2013.01); *H01L 2224/2908* (2013.01); *H01L 2224/29082* (2013.01); *H01L 2224/29083* (2013.01); *H01L 2224/29084* (2013.01); *H01L 2224/29109* (2013.01); *H01L 2224/29113* (2013.01); *H01L 2224/29139* (2013.01); *H01L 2224/29166* (2013.01); *H01L 2224/32225* (2013.01); *H01L 2224/32245* (2013.01); *H01L 2224/32505* (2013.01); *H01L 2224/83054* (2013.01); *H01L 2224/83193* (2013.01); *H01L 2224/83203* (2013.01); *H01L 2224/83359* (2013.01); *H01L 2224/83539* (2013.01); *H01L 2224/83825* (2013.01); *H01L 2224/83902* (2013.01); *H01L 2224/83948* (2013.01); *H01L 2924/12041* (2013.01)

(56) References Cited

U.S. PATENT DOCUMENTS

| | | | |
|---|---|---|---|
| 2014/0273318 A1* | 9/2014 | Ryu | B23K 1/0006 438/26 |
| 2014/0353015 A1* | 12/2014 | Hoepfner | H05K 1/181 174/255 |

FOREIGN PATENT DOCUMENTS

| | | |
|---|---|---|
| EP | 1433564 A1 | 6/2004 |
| EP | 2328192 A2 | 6/2011 |
| WO | 03097294 A1 | 11/2003 |

OTHER PUBLICATIONS

Dittes, M., "Elektronikweichlote für spritzgegossenen Schaltungsträger (Electronics Solders for Injection Molded Interconnect Devices)," Institut für Materialforschung—Bayreuth (Institute for Materials Research—Bayreuth), Herbert Utz Verlag 1999, pp. 13.
Wikipedia, "Bismut (Bismuth)," http://de.wikipedia.org/w/index.php?title=Bismut&oldid=115315790, Mar. 12, 2013, 12 pages.
Wu, Y.Y., et al., "A study of chemical reactions of silver and indium at 180° C.," Journal of Materials Science: Materials in Electronics, vol. 23, Issue 12, Jun. 12, 2012, pp. 2235-2244.
Bernstein, L, "Semiconductor Joining by the Solid-Liquid-Interdiffusion (SLID) Process," Journal of the Electrochemical Society, vol. 113, No. 12, Dec. 1966, pp. 1282-1288.
Cook, G.O. et al., "Overview of transient liquid phase and partial transient liquid phase bonding," Journal of Materials Science, vol. 46, Issue 16, May 7, 2011, pp. 5305-5323.
Dittes, M., "Elektronikweichlote fur spritzgegossenen Schaltungsträger (Electronics Solders for Injection Molded Interconnect Devices)," Institut fur Materialforschung—Bayreuth (Institute for Materials Research—Bayreuth), Herbert Utz Verlag 1999, pp. 13.
Liu, X.J., et al., "Thermodynamic Calculations of Phase Equilibria, Surface Tension and Viscosity in the In—Ag—X (X=Bi, Sb) System," Materials Transactions, vol. 45, No. 3, Jun. 24, 2005, pp. 637-645.
Matthews, M., et al., "PTH Core-to-Core Interconnect Using Sintered Conductive Pastes," Ormet Circuits, Inc., Jun. 27, 2012, 7 pages.
Vassiliev, V., et al., "Thermodynamics of the Ag—Bi—In system (with $0 < xAg < 0.5$)," Journal of Alloys and Compounds, vol. 265, Jan. 1998, pp. 160-169.
Wikipedia, "Bismut (Bismuth)," http://de.wikipedia.org/w/index_php?title=Bismut&oldid=115315790, Mar. 12, 2013, 12 pages.

* cited by examiner

PROCESS FOR CONNECTING JOINING PARTS

This patent application is a national phase filing under section 371 of PCT/EP2014/055848, filed Mar. 24, 2014, which claims the priority of German patent application 10 2013 103 081.5, filed Mar. 26, 2013, each of which is incorporated herein by reference in its entirety.

TECHNICAL FIELD

A method is provided for connecting parts to be joined. An arrangement of parts to be joined is also provided.

BACKGROUND

German Patent Publication DE 102005029246, also published as U.S. Pat. No. 7,598,529 B2, describes a method for forming a soldered joint between a carrier and a semiconductor chip.

SUMMARY

Embodiments of the present invention provide a method for connecting two parts to be joined, in which a joint between the parts to be joined may be produced at a relatively low temperature, wherein the resultant joint is particularly temperature-stable. The parts can be joined by means of an isothermic solidifying reaction in order to form an In—Bi—Ag connecting layer and corresponding arrangement of joining parts.

According to at least one embodiment of the method, firstly a first part to be joined and a second part to be joined are provided. The parts to be joined may, for example, be at least one of the following elements: optoelectronic semiconductor chip, wafer of optoelectronic semiconductor chips, metallic lead frame, metallic lead frame sheathed with plastics material, ceramic carrier, printed circuit board (board), semiconductor wafer of GaAs, Ge or Si, ceramic wafer of $Si_3N_4$ or AlN or the like. The method may be used, for example, to fasten an optoelectronic semiconductor chip, for example, a light-emitting diode chip, to a printed circuit board or a metallic lead frame.

According to at least one embodiment of the method, a first layer sequence is applied to the first part to be joined. The first layer sequence comprises at least one layer containing at least one metal or consisting of a metal. The first layer sequence is applied to the first part to be joined, for example, by physical vapor deposition such as sputtering or vacuum evaporation, electrodeposition or electroless deposition.

According to at least one embodiment of the method, a second layer sequence is applied to the second part to be joined. The second layer sequence may be applied using the same method as for application of the first layer sequence. The first and the second layer sequences may be identical. It is however also possible for the first and second layer sequences to differ from one another in terms of structure, i.e., the sequence of layers in the layer sequence and/or in terms of the materials used for the layers of the layer sequence. It is moreover possible for the first and second layer sequences to be produced using different deposition methods.

According to at least one embodiment of the method, the first layer sequence and the second layer sequence are pressed together at their end faces remote respectively from the first part to be joined and the second part to be joined through application of a joining pressure at a joining temperature for a predetermined joining time. In other words, the end face of the first layer sequence remote from the first part to be joined is firstly brought into contact with the end face of the second layer sequence remote from the second part to be joined. Then the two layer sequences are pressed together at the end faces through application of a joining pressure at a joining temperature for a predetermined period of time, the joining time. In the process, the first layer sequence and the second layer sequence are at least partly or completely melted and the materials of the two layer sequences mix together.

According to at least one embodiment of the method, the first layer sequence and the second layer sequence fuse together to form a bonding layer, which directly adjoins the first part to be joined and the second part to be joined. In other words, after the joining time the layer sequences are joined together to form the bonding layer, which is then located between the two parts to be joined and brings about a mechanical connection between the parts to be joined.

According to at least one embodiment of the method, the first layer sequence comprises at least one layer which contains silver or consists of silver. For example, the first layer sequence may then also consist of this silver layer.

According to at least one embodiment of the method, the second layer sequence comprises at least one layer which contains indium and bismuth or the second layer sequence contains at least one layer which contains indium and one layer which contains bismuth. In other words, the second layer sequence contains at least indium and bismuth as metals. It is possible, for example, for the second layer sequence not to contain any other metals beyond these. The metals indium and bismuth may occur in the second layer sequence in a single common layer, for example, as an indium-bismuth alloy. It is moreover possible for the second layer sequence to contain at least one individual layer which consists of indium and one individual layer which consists of bismuth. It is moreover possible for the first layer and/or the second layer to be free of lead and/or tin. In addition, the first layer and/or the second layer may be free of gold.

According to at least one embodiment of the method, the joining temperature, to which the first layer sequence and the second layer sequence are heated during joining, amounts to at most 120° C. The first layer sequence and the second layer sequence fuse together or bond at this temperature to form the bonding layer, which then contains silver, indium and bismuth and only melts again at much higher temperatures of above approximately 260° C.

According to at least one embodiment of the method for connecting parts to be joined, the method comprises the following steps:

providing a first part to be joined and a second part to be joined, applying a first layer sequence to the first part to be joined, applying a second layer sequence to the second part to be joined, pressing together the first layer sequence and the second layer sequence at their end faces remote respectively from the first part to be joined and the second part to be joined through application of a joining pressure at a joining temperature for a predetermined joining time, wherein the first layer sequence comprises at least one layer which contains silver or consists of silver, the second layer sequence comprises at least one layer which contains indium and bismuth or the second layer sequence contains at least one layer which contains indium and one layer which contains bismuth, the joining temperature amounts to at most 120° C., and the first layer sequence and the second layer sequence fuse together to form a bonding layer, which directly adjoins the first part to be joined and the second part to be joined.

The method described here for connecting parts to be joined makes use inter alia of the following considerations:

To connect parts to be joined, for example, to combine semiconductor devices with packages or boards or when mounting packaged electronic components on boards, soft solders and soft-soldering may be used as the connection method. To keep the thermal load on the parts to be joined low, low joining temperatures are sought. Known soft-soldering methods are based, for example, on Sn—Ag—Cu (SAC) material systems or on Sn—Pb material systems.

In this soft soldering method, the liquid solder solidifies on cooling to below its melting point. If the joint is heated back up to the melting point temperature, it loses its strength. A plurality of integration steps in succession, for instance the mounting of a semiconductor chip on a ceramic board and subsequent soldering of the ceramic to a metal-core board, cannot therefore be performed using the same soldering systems without endangering the integrity of the soldered joint produced first.

This problem could be overcome by using different soldering systems with graduated melting points. Another possibility consists in using an isothermal solidification reaction on cooling instead of conventional eutectic solidification. In this case, at a constant joining temperature a permanently strong joint with a melting point which may be a long way above the joining temperature is formed by reaction of the metal melt with a higher-melting metal component. So as not to damage joints with the above-stated SAC alloys as bonding agents in a subsequent joining step, it is, for example, possible to use hybrids of solder and adhesive. One example is TLPS (Transient Liquid Phase Sintering) pastes, which allow a lower-melting Bi—Sn alloy to solidify isothermally with copper in order to connect the parts to be joined without damaging a previously produced SAC joint and without ruling out a subsequent SAC joint. Fluxing agents, which are intended to ensure the reactivity of the non-noble component of Bi—Sn, are embedded in the adhesive matrix.

A further alternative is isothermal solidification with Au—Sn as bonding agent, which however on the one hand is expensive due to the high gold content required and which, due to the relatively high melting points of tin or a eutectic Au—Sn alloy, requires higher process temperatures than are acceptable for many parts to be joined.

The method described here is based inter alia on the concept of using an isothermal solidification process which on the one hand uses a lower-melting component than Sn or AuSn, and on the other hand avoids the expensive noble metal gold. The first and/or the second layer may thus be free of lead, tin and/or gold, which are normally used in connection methods. Furthermore, thin layers are used to produce the first and second layer sequences, whereby particularly simple melting of the layer sequences may take place.

A mixture of bismuth and indium is used as the low-melting component. In the bismuth-indium system a melt may be formed even markedly below 100° C. By the addition of silver the melting temperature may then be raised massively. An isothermal solidification reaction of bismuth-indium with silver leads to the formation of intermetallic bonds between silver and indium at just 100° C. The indium content of the bismuth-indium is thus reduced and the melting temperature of the bond increases to around 260° C., wherein the intermetallic silver-indium bonds remain strong. The low-melting component may then consist of a bismuth-indium alloy or it may be produced in situ during the joining process from the inter-reaction of pure bismuth layers and indium layers.

According to at least one embodiment of the method, the bonding layer comprises regions which contain bismuth or consist of bismuth, wherein the regions are completely surrounded by a material which contains indium and/or silver. It has been found that the bonding layer is particularly stable, in particular thermally stable, if after the joining process the bismuth component of the bonding layer, in which small quantities of indium and silver may be dissolved, does not form a contiguous, uninterrupted layer. In particular, the introduction of silver into the bonding layer may markedly raise the melting temperature in comparison with the joining temperature. For example, the melting temperature in ° C. may be at least twice as high as the joining temperature in ° C.

In particular through the selection of the joining time, it is possible to ensure that a continuous bismuth layer present in the first or second layer sequence develops interruptions. The bonding layer then no longer comprises a continuous bismuth layer, but rather is free of such a layer consisting of bismuth or the bonding layer is free of a simply contiguous layer consisting of bismuth. The bismuth layer may then, for example, be reticular in form, i.e., it has holes or openings which are filled with the other metals of the layer sequences. With longer joining times it is possible for the bismuth layer which may be present in the first layer sequence or the second layer sequence prior to joining to break up into individual grains, which are surrounded by the material of the other metals of the layer sequences, i.e., in particular indium and silver.

This influencing of structure may here be brought about by the joining process or in addition by a subsequent tempering step, in which the bonding layer is reheated. From a thermal and mechanical point of view, the bismuth grains, i.e., the regions which contain bismuth or consist of bismuth, in a matrix of intermetallic bonds of silver and indium or in a silver-indium alloy with silver grains, in which indium has been dissolved, constitute a particularly favorable microstructure of the joining zone and thus of the bonding layer.

According to at least one embodiment of the method, in a cross-sectional area of the bonding layer the proportion of the cross-sectional area which consists of bismuth amounts to at most 50%. The cross-sectional area may here, for example, extend through the entire bonding layer from the first part to be joined to the second part to be joined. The cross-sectional area is then any desired section through the bonding layer, which extends, for example, perpendicular to the main plane of extension of the two parts to be joined. In this cross-sectional area on average at most half of the area consists of bismuth with the remainder distributed between silver and indium and any further metals which may be present. The proportion of the area here occupied by bismuth preferably amounts to at most 30%, particularly preferably at most 15%.

According to at least one embodiment of the method, the bonding layer is electrically conductive. This means that the bonding layer not only constitutes a mechanical connection between the two parts to be joined, but rather the two parts to be joined may also be connected together electrically conductively by the bonding layer. In this way, an optoelectronic semiconductor chip may, for example, be mechanically fastened and electrically connected to a printed circuit board by way of the bonding layer. The electrically conductive connection may in particular be produced by the silver content in the bonding layer, which connects the parts to be joined together via paths which are not interrupted by a contiguous bismuth layer.

According to at least one embodiment of the method, the bonding layer is free of gold and free of fluxing agents. Omitting gold from the bonding layer leads to a particularly inexpensive bonding layer, which may be produced at particularly low temperatures. The low joining temperature, which is made possible by selecting a metal alloy which is liquid even at particularly low temperatures, reduces the thermomechanical load in a composite of materials with different thermal expansion behaviors and protects thermally sensitive substances, for example, plastics materials on an injection-molded lead frame. The method in particular makes it possible to connect two parts to be joined which consist of materials with different thermal expansion behaviors. For example, the first part to be joined may be at least one optoelectronic semiconductor chip, while the second part to be joined is a metallic lead frame sheathed in plastics material. In general, the first part to be joined may contain a metal, a ceramic or a plastics material, while the second part to be joined is formed with at least one other metal, at least one other ceramic or at least one other plastics material, wherein the at least one metal, the at least one ceramic or the at least one plastics material of the second part to be joined has a different coefficient of thermal expansion from the metal, the ceramic or the plastics material of the first part to be joined. The low costs of the high-melting component make it possible to use the method also in products where cost is critical.

Since the stated metals in the first and second layer sequences may be applied in very pure form, the use of fluxing agents may be dispensed with. The bonding layer is thereby free of fluxing agents. In this way, low thermal conductivity of a metal-polymer hybrid is however also avoided. Furthermore, by dispensing with fluxing agents the corrosion risks caused by the inclusion of fluxing agent residues or the problems involved in the later removal of fluxing agent remainders and fluxing agent residues and the associated costs are avoided.

Due to the good thermal conductivity of indium and silver, the bonding layer is moreover particularly well suited to dissipating waste heat. In this respect, it has proven advantageous for the bonding layer to be free of a continuous layer of bismuth, since bismuth has the lowest thermal conductivity of the stated metals. For the best possible heat dissipation, the proportion of silver in the bonding layer is therefore selected to be as high as possible and the proportion of bismuth as low as possible. Also, for the best possible resistance of the bonding layer at temperatures above 260° C., the proportion of silver should be selected to be as high as possible and the proportion of bismuth as low as possible.

According to at least one embodiment of the method, the first layer sequence and/or the second layer sequence comprises(s) a layer or a sequence of directly adjacent layers, wherein the layer or the sequence of layers contains exclusively indium and bismuth, wherein the mole fraction of indium is at least 67 at % and at most 85 at %. The mole fraction of indium ideally amounts to 78.5 at %.

With such an indium content in the region of the layer sequences consisting of indium and bismuth, a melt of these regions may be formed even markedly below 100° C. Such a melt then forms at a temperature as low as around 73° C. The addition of silver from neighboring layers of a layer sequence or from the first layer sequence, if the indium-bismuth melt is produced, for example, in the second layer sequence, may then raise the melting temperature significantly. An isothermal solidification reaction of bismuth-indium with silver leads even at 100° C. to the formation of intermetallic bonds between silver and indium, which leads to the elevated heat resistance of the bonding layer. To achieve the best possible melting behavior of the proportion of the layer sequences which consists of bismuth and indium, a ratio of bismuth to indium in these regions of the layer sequences of around 0.27 is ideal.

According to at least one embodiment of the method, the first layer sequence and/or the second layer sequence comprises at least one layer which consists of indium and at least one layer which consists of bismuth, wherein the layer of indium and the layer of bismuth directly adjoin one another. This means that in this case the low-melting component consisting of bismuth and indium is not present as an alloy, but rather the low-melting component is produced during the joining process from the inter-reaction of the directly adjacent bismuth layers and indium layers.

According to at least one embodiment of the method, the second layer sequence consists of a layer formed with a bismuth-indium alloy. In this case, the low-melting component is thus embodied directly as an alloy and not deposited in individual, separate bismuth layers and indium layers one on top of the other.

According to at least one embodiment of the method, the first layer sequence and/or the second layer sequence comprises a layer which consists of titanium and which directly adjoins a layer of indium or a layer of bismuth, wherein the layer of titanium is provided to delay mixing together of silver with indium and/or bismuth. For example, a part of the layer sequence which contains indium and bismuth is initially kept free of the surrounding silver by the titanium layer during melting. Only once a given temperature has been reached in the layer sequence at which the individual layers of indium and bismuth have reacted to yield the low-melting component does the layer of titanium break up, for example, and allow penetration of silver into the region with indium and bismuth and thus isothermal solidification to form the bonding layer.

According to at least one embodiment of the method, the first layer sequence and/or the second layer sequence comprises a sequence of layers of indium and layers of bismuth, wherein the sequence is covered at its end faces in each case by a layer of titanium. In other words, a region in the layer sequences which is formed with indium and bismuth may be protected at both ends from the adjoining silver by titanium layers. In this way, it is particularly efficiently possible to delay the penetration of silver until the indium and bismuth layers are sufficiently mixed to form the low-melting component.

According to at least one embodiment of the method, at least half the layers of titanium or every layer of titanium which is used in the layer sequences have/has a thickness of at most 10 nm. This means that extremely thin titanium layers are sufficient to protect the layers of indium and bismuth.

According to at least one embodiment of the method, at least half the layers of indium or every layer of indium are/is thicker than at least half the layers of bismuth or every layer of bismuth in the layer sequences, wherein at least half the layers of indium or every layer of indium have/has a thickness of at least 150 nm and at most 850 nm and at least half the layers of bismuth or every layer of bismuth have/has a thickness of at least 50 nm and at most 300 nm. By means of the layer thicknesses of the layers of indium and bismuth, it is then possible to adjust the indium content in the indium-bismuth system, wherein an ideal indium content of between 67 at % and 85 at % is sought, as described above.

According to at least one embodiment of the method, at least some layers, in particular all the layers of the first and second layer sequences are produced by means of at least one of the following deposition methods: physical vapor deposition such as sputtering or vacuum evaporation. With these methods particularly thin layers may be used to produce the layer sequences. By using the stated deposition methods, oxidation of the non-noble elements may be effectively prevented and particularly pure layers of indium and bismuth may be produced.

An arrangement of parts to be joined is also provided. The arrangement may be produced using a method described here. In other words, all the features described for the method are also disclosed for the arrangement and vice versa.

According to at least one embodiment of the arrangement, the arrangement comprises a first part to be joined and a second part to be joined, and a bonding layer which directly adjoins the first part to be joined and the second part to be joined, wherein the bonding layer has regions which contain bismuth or consist of bismuth, wherein the regions are completely surrounded by a material which contains indium and/or silver.

BRIEF DESCRIPTION OF THE DRAWINGS

The method described here and the arrangement described here are explained in greater detail below with reference to exemplary embodiments and the associated figures.

The schematic sectional representation in FIGS. 1, 2, 3, 4 and 5 show exemplary embodiments of methods described here.

Figure 6:
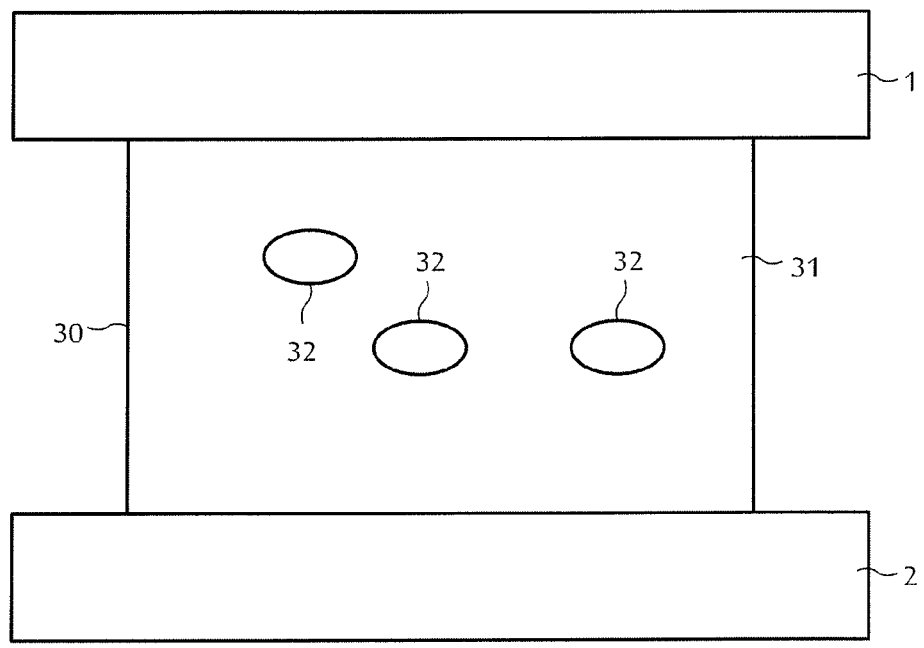

The schematic sectional representation of FIG. 6 shows an arrangement of parts to be joined with a bonding layer produced using the method described here.

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

Figure 1:
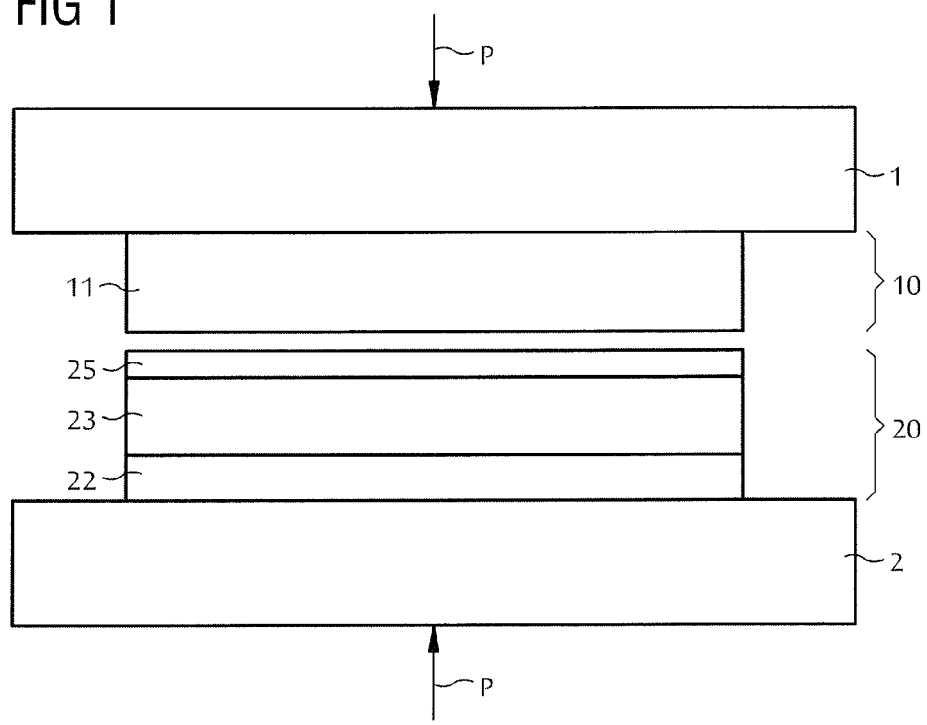

The schematic sectional representation of FIG. 1 shows a first part to be joined 1, which may, for example, comprise a light-emitting diode chip. Using the method described here, the first part to be joined 1 is connected to the second part to be joined 2, which may, for example, comprise a copper lead frame sheathed with plastics material. The first layer sequence 10, which in the present case consists of a silver layer 11, is applied to the first part to be joined 1. The silver layer 11 has a thickness of 1825 nm, for example.

A second layer sequence 20, which in the present case comprises a 270 nm thick bismuth layer 22, a 730 nm thick indium layer 23 and a 135 nm thick silver layer 25, is applied to the second part to be joined 2. The first layer sequence 10 and the second layer sequence 20 are pressed together at their end faces respectively remote from the first part to be joined 1 and the second part to be joined 2 under the pressure p, wherein the arrangement is pressed together at a joining temperature of 100° C. for 0.5 s. The mutually facing silver layers 11, 25, in particular under a sulfur-free atmosphere, form sufficient protection against oxidation and tarnishing of the joint surface at which the two layer sequences are connected together. Once the joining time has elapsed, the temporarily formed bismuth-indium melt forms solid silver-indium and bismuth.

Figure 2:
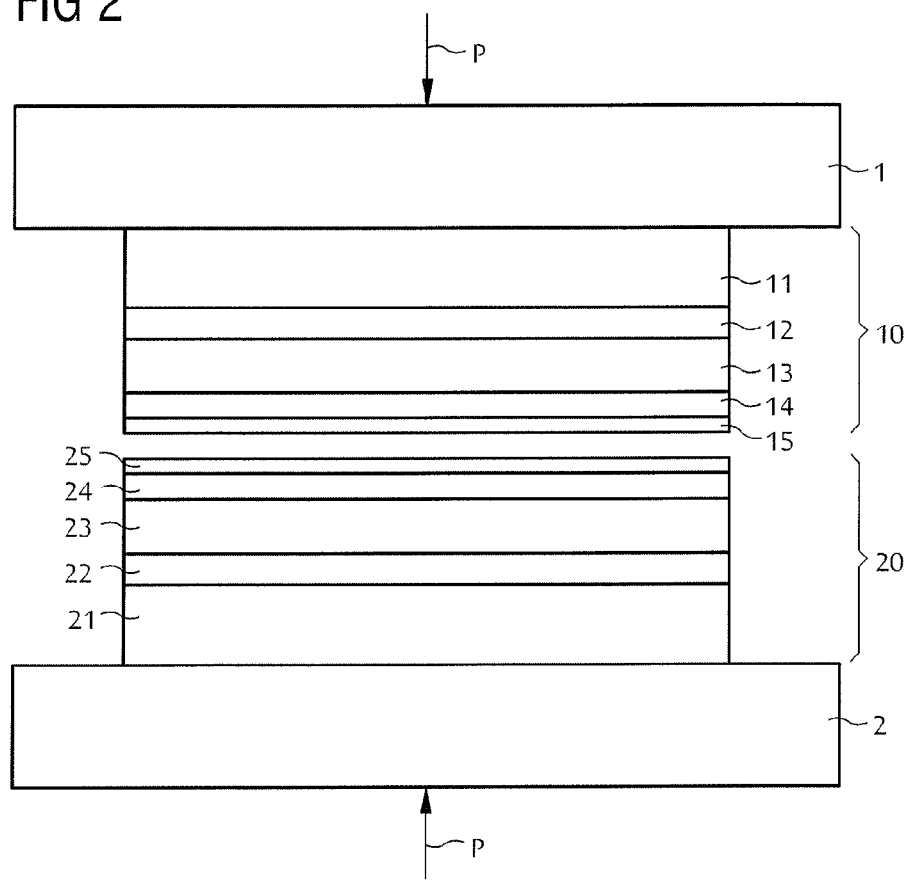

In conjunction with FIG. 2, an exemplary embodiment is described in which the first layer sequence 10 comprising a 2560 nm thick silver layer 11, a 161 nm thick bismuth layer 12, an 804 nm thick indium layer 13, a 147 nm thick bismuth layer 14 and a 74 nm thick silver layer 15 is applied by sputtering to the first part to be joined 1. The second layer sequence 20 is applied to the second part to be joined 2 in the same sequence of layers, as follows: a 2560 nm thick silver layer 21, a 161 nm thick bismuth layer 22, a 804 nm thick indium layer 23, a 147 nm thick bismuth layer 24 and a 74 nm thick silver layer 25.

Once the end faces of the layer sequences have been brought together, the parts to be joined 1, 2 are connected together for a joining time of around 5 minutes at a joining temperature of 85° C. and a joining pressure of 2.5 bar. The parts to be joined 1, 2 comprise a ceramic board and a metal-core board, for example.

Figure 3:
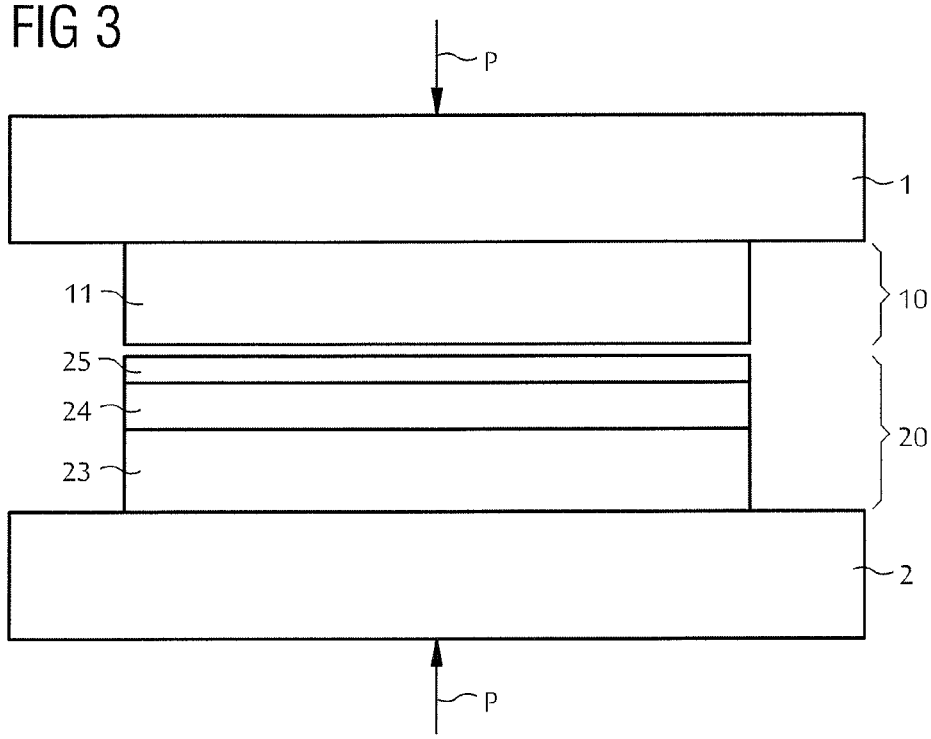

In conjunction with FIG. 3, an exemplary embodiment is described in which a semiconductor disk of GaAs is used as the first part to be joined 1 and a ceramic disk of $Si_3N_4$ or AlN is used as the second part to be joined 2. A 511 nm thick silver layer 11, which forms the first layer sequence, is deposited electrochemically onto the first part to be joined 1. The second layer sequence 20 on the second part to be joined 2 comprises a 428 nm thick indium layer 23, a 72 nm thick bismuth layer 24 and a 190 nm thick silver layer 25, which are each applied by vacuum evaporation. At a joining temperature of 115° C. and a joining pressure of 10 bar, the two parts to be joined 1, 2 are pressed together for 120 minutes and connected together in this manner.

Figure 4:
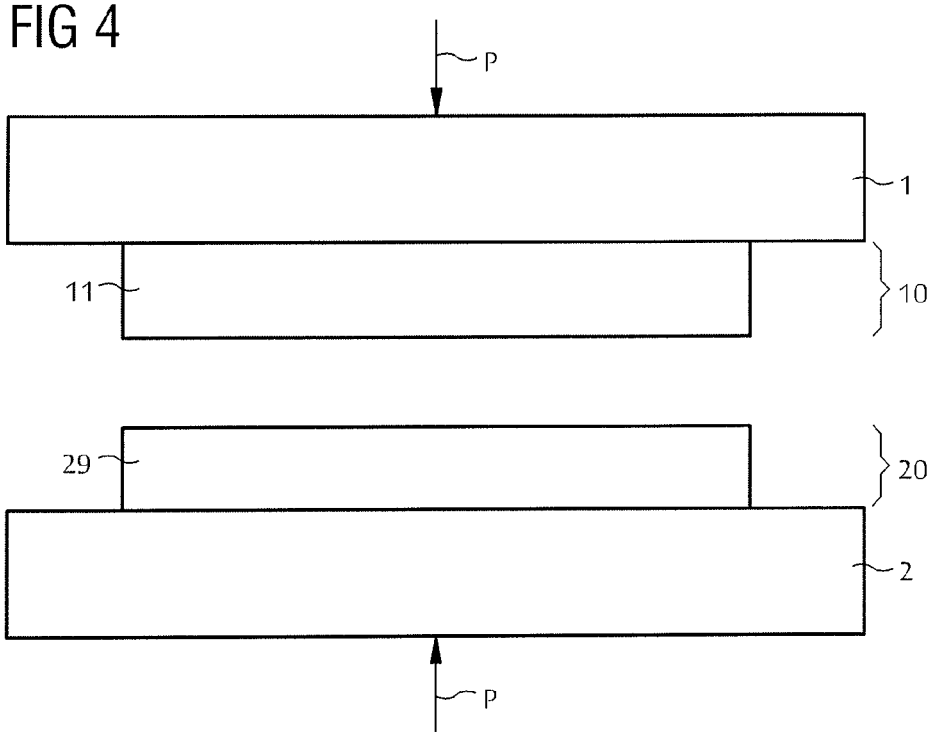

In conjunction with FIG. 4, an exemplary embodiment is described in which a 1775 nm thick silver layer is applied to the first part to be joined 1 as the first layer sequence 10. The indium-bismuth layer 29 is applied to the second part to be joined 2 as the second layer sequence 20. The indium-bismuth layer 29 consists of an indium-bismuth alloy with 33.3 percent by mass of bismuth, which is applied by sputtering or plasma spraying and which has a thickness of 775 nm. Before joining, the end faces of the first layer sequence 10 and the second layer sequence 20 which are remote from the respective parts to be joined are cleaned wet chemically, for example, with an aqueous solution of formic acid. Connection then proceeds at a joining pressure of 15 bar and a joining temperature of 95° C. over a joining time of 30 minutes.

Figure 5:
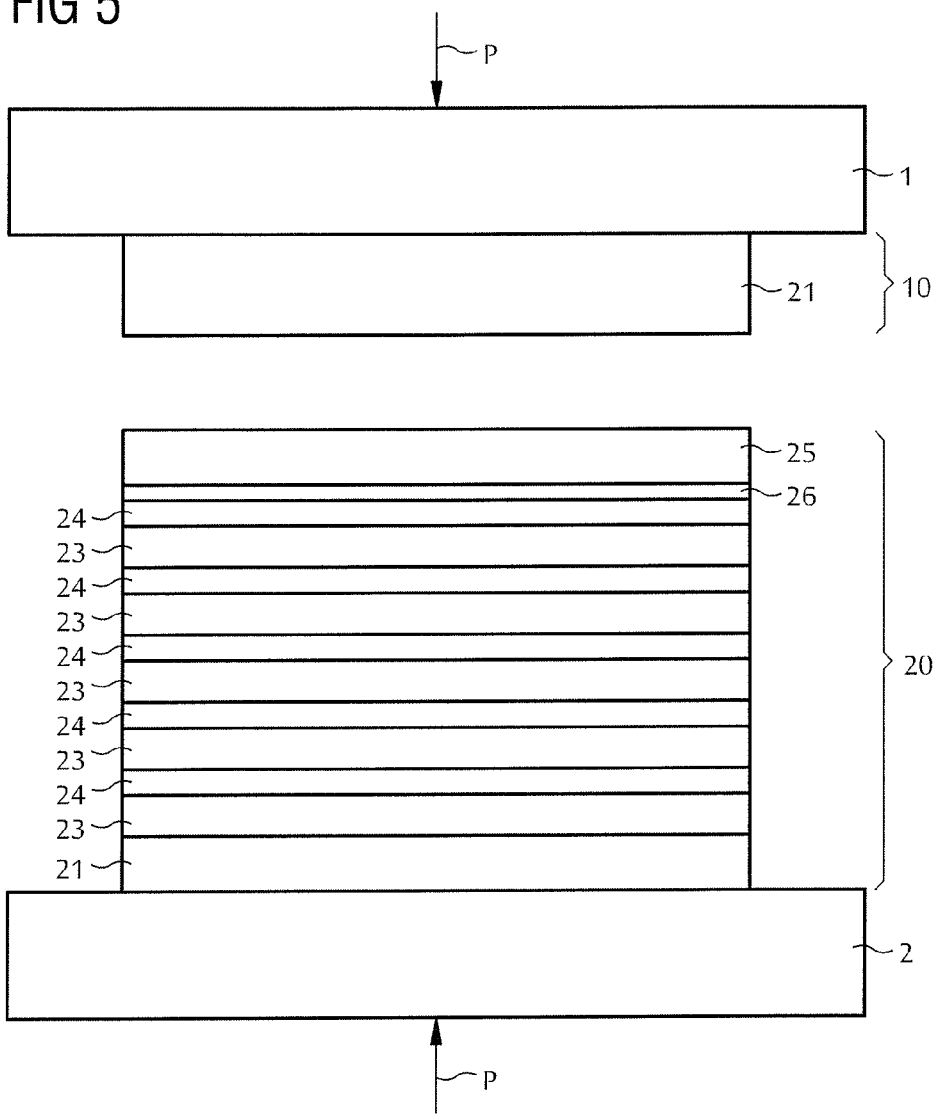

An exemplary embodiment is described in conjunction with FIG. 5 in which a silver layer 11 with a thickness of at least 160 nm and at most 1500 nm, for example 1350 nm, is applied as the first layer sequence 10 to the first part to be joined.

A layer stack of five pairs of in each case 187 nm thick indium layers 23 and 63 nm thick bismuth layers 24 is applied by vacuum evaporation to the second part to be joined 2 over a 1000 nm thick silver layer 21, said stack being covered by a 260 nm thick silver layer 25 separated therefrom by an 8 nm thick titanium layer 26. The titanium layer 26 here protects against premature intermixing of bismuth or indium on the one hand and silver on the other hand. Such a titanium layer may also be introduced between the silver layer 21 and the layer stack of indium and bismuth.

Furthermore, it is also possible to introduce such a titanium layer between every pair of indium and bismuth layers, if intermixing is to be delayed for a particularly long time.

FIG. 6 shows connection of the first part to be joined 1 and the second part to be joined 2 by the bonding layer 30 to form an arrangement of parts to be joined as described here, which is produced by a method described here. The bonding layer 30 comprises regions 32 which contain bismuth or consist of bismuth. For example, the regions 32 comprise bismuth grains in which small quantities of silver and/or indium may be dissolved. The bismuth regions 32 are surrounded on all sides by the material 31 containing silver and indium. The proportion of the area occupied by the regions of bismuth amounts in the cross-section shown preferably to at most 15%.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for connecting parts to be joined, the method comprising:
    providing a first part to be joined and a second part to be joined;
    applying a first layer sequence to the first part to be joined, wherein the first layer sequence comprises at least one layer that contains silver;
    applying a second layer sequence to the second part to be joined, wherein the second layer sequence comprises at least one layer that contains indium and bismuth or the second layer sequence comprises at least one layer which contains indium and at least one layer which contains bismuth; and
    pressing together the first layer sequence and the second layer sequence at their end faces respectively remote from the first part to be joined and the second part to be joined through application of a joining pressure at a joining temperature of at most 120° C. for a predetermined joining time so that the first layer sequence and the second layer sequence fuse together to form a bonding layer, which directly adjoins the first part to be joined and the second part to be joined.

2. The method according to claim 1, the bonding layer has a melting temperature of at least 260° C.

3. The method according to claim 1, wherein the bonding layer has regions that contain bismuth, wherein the regions are completely surrounded by a material which contains indium and/or silver.

4. The method according to claim 1, wherein the bonding layer is free of a layer consisting essentially of bismuth.

5. The method according to claim 4, wherein the bonding layer is electrically conductive.

6. The method according to claim 5, wherein the bonding layer is free of gold and free of fluxing agents.

7. The method according to claim 1, wherein, in a cross-sectional area of the bonding layer, the proportion of the cross-sectional area which consists of bismuth amounts to at most 50%.

8. The method according to claim 1, wherein the first layer sequence or the second layer sequence comprises a layer or a sequence of directly adjacent layers, wherein the layer or the sequence of layers contains exclusively indium and bismuth, wherein the mole fraction of indium is at least 67 at % and at most 85 at %.

9. The method according to claim 1, wherein the first layer sequence or the second layer sequence comprise at least one layer that consists essentially of indium and at least one layer that consists essentially of bismuth, wherein the layer of indium and the layer of bismuth directly adjoin one another.

10. The method according to claim 1, wherein the second layer sequence comprises a layer formed with a bismuth-indium alloy.

11. The method according to claim 1, wherein the first layer sequence or the second layer sequence comprises a layer that consists essentially of titanium and that directly adjoins a layer of indium or a layer of bismuth.

12. The method according to claim 11, wherein each layer of titanium has a thickness of at most 10 nm.

13. The method according to claim 1, wherein the first layer sequence or the second layer sequence comprises a sequence of layers of indium and layers of bismuth, wherein the sequence is covered at each end face by a layer of titanium.

14. The method according to claim 1, wherein the second layer sequence comprises a plurality of layers that contain indium and a plurality of layers that contain bismuth, wherein at least half the layers of indium are thicker than at least half the layers of bismuth, wherein at least half the layers of indium have a thickness of at least 150 nm and at most 850 nm, and wherein at least half the layers of bismuth have a thickness of at least 50 nm and at most 300 nm.

15. The method according to claim 1, wherein at least some layers of the first and second layer sequences are produced by one of the following deposition methods: physical vapor deposition, electrodeposition or electroless deposition.

16. An arrangement of parts to be joined, the arrangement comprising:
    a first part to be joined;
    a second part to be joined; and
    a bonding layer, which directly adjoins the first part to be joined and the second part to be joined, wherein the bonding layer has regions that contain bismuth and wherein the regions are completely surrounded by a material that contains indium or silver.

17. The arrangement of parts to be joined according to claim 16, wherein the first part to be joined and the second part to be joined comprise materials with different thermal expansion behaviors.

18. The arrangement of parts to be joined according to claim 16, wherein the bonding layer is free of a layer consisting of bismuth.

19. The arrangement of parts to be joined according to claim 16, wherein in a cross-sectional area of the bonding layer, the proportion of the cross-sectional area which consists essentially of bismuth amounts to at most 50%.

20. The arrangement of parts to be joined according to claim 16, wherein the bonding layer has a melting temperature of at least 260° C.

21. A method for connecting parts to be joined, the method comprising:
    providing a first part to be joined and a second part to be joined;
    applying a first layer sequence to the first part to be joined;
    applying a second layer sequence to the second part to be joined;
    pressing together the first layer sequence and the second layer sequence at their end faces respectively remote from the first part to be joined and the second part to be joined through application of a joining pressure at a joining temperature for a predetermined joining time;

wherein the first layer sequence comprises at least one layer which contains silver;

wherein the second layer sequence comprises at least one layer which contains indium and bismuth or the second layer sequence comprises at least one layer which contains indium and one layer which contains bismuth;

wherein the joining temperature amounts to at most 120° C.;

wherein the first layer sequence and the second layer sequence fuse together to form a bonding layer, which directly adjoins the first part to be joined and the second part to be joined;

wherein the bonding layer has a melting temperature of at least 260° C.; and wherein the first part to be joined and the second part to be joined comprises materials with different thermal expansion behaviors.

* * * * *